United States Patent
Furutono et al.

(10) Patent No.: US 8,550,801 B2
(45) Date of Patent: Oct. 8, 2013

(54) IMPRINT APPARATUS AND METHOD

(75) Inventors: Yohko Furutono, Tokyo (JP); Shinji Mikami, Kawasaki (JP); Masayuki Hatano, Kawasaki (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 13/230,554

(22) Filed: Sep. 12, 2011

(65) Prior Publication Data

US 2012/0061882 A1    Mar. 15, 2012

(30) Foreign Application Priority Data

Sep. 13, 2010 (JP) ................................. 2010-204608

(51) Int. Cl.
*B29C 59/02* (2006.01)

(52) U.S. Cl.
USPC ........ 425/139; 425/385; 425/174.4; 425/150; 264/496; 264/293; 264/334

(58) Field of Classification Search
USPC ....... 425/385, 150, 140, 139, 174.4, 436 RM, 425/169, 441, 443; 264/496, 293, 334, 29
See application file for complete search history.

(56) References Cited

U.S. PATENT DOCUMENTS

2009/0045539 A1 * 2/2009 Yoneda ........................ 264/40.5

FOREIGN PATENT DOCUMENTS

| JP | 2008-183731 | 8/2008 |
| JP | 2009-023101 | 2/2009 |

* cited by examiner

*Primary Examiner* — Joseph S Del Sole
*Assistant Examiner* — Lawrence D Hohenbrink, Jr.
(74) *Attorney, Agent, or Firm* — Finnegan, Henderson, Farabow, Garrett & Dunner, L.L.P.

(57) ABSTRACT

In one embodiment, an imprint apparatus includes a template holding part configured to hold a template for imprint. The apparatus further includes a template moving part configured to move the template to press the template onto a light curing resin on a transfer target substrate or to demold the template from the light curing resin. The apparatus further includes a light source configured to irradiate the light curing resin with light to cure the light curing resin. The apparatus further includes a demold control part configured to control a demold speed or a demold angle of the template, based on a position of a shot region from which the template is to be demolded, when demolding the template from the light curing resin.

10 Claims, 7 Drawing Sheets

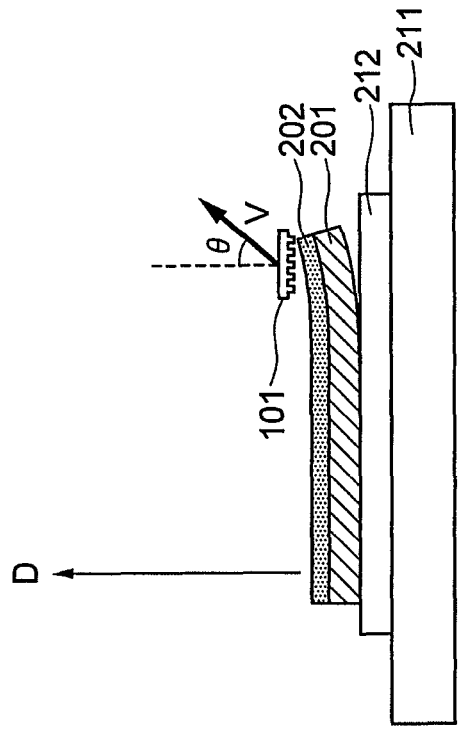
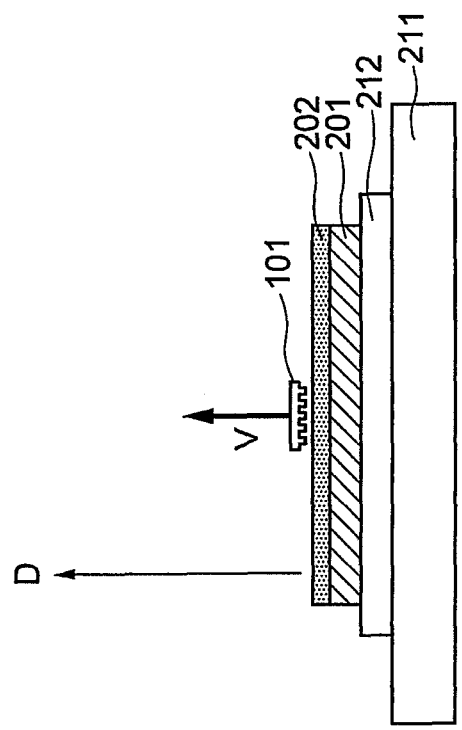

IMPRINT APPARATUS AND METHOD

CROSS REFERENCE TO RELATED APPLICATION

This application is based upon and claims the benefit of priority from the prior Japanese Patent Application No. 2010-204608, filed on Sep. 13, 2010, the entire contents of which are incorporated herein by reference.

FIELD

Embodiments described herein relate to an imprint apparatus and method.

BACKGROUND

In a nanoimprint method, a template having an intended pattern is prepared, and pressed onto an imprint material formed on a wafer (transfer target substrate). Then, the imprint material is cured by exposure while the template is pressed onto the imprint material, so that the pattern is transferred onto the imprint material.

In this method, since the template is bonded with the wafer via the imprint material, a strong force is necessary for separating (demolding) the template from the wafer. Moreover, in an imprint apparatus to imprint the pattern on the entire surface of the wafer by a step and repeat method, the wafer chuck force near the periphery on the wafer is weaker than that near the center on the wafer.

Therefore, when the template is demolded from the periphery, the wafer may be detached from the wafer chuck due to the strong force. This becomes a problem when the nanoimprint method is applied for mass production.

BRIEF DESCRIPTION OF THE DRAWINGS

FIGS. 6A and 6B are side sectional views for explaining a demold angle of a template;

DETAILED DESCRIPTION

Embodiments will now be explained with reference to the accompanying drawings.

An embodiment described herein is an imprint apparatus including a template holding part configured to hold a template for imprint. The apparatus further includes a template moving part configured to move the template to press the template onto a light curing resin on a transfer target substrate or to demold the template from the light curing resin. The apparatus further includes a light source configured to irradiate the light curing resin with light to cure the light curing resin. The apparatus further includes a demold control part configured to control a demold speed or a demold angle of the template, based on a position of a shot region from which the template is to be demolded, when demolding the template from the light curing resin.

Another embodiment described herein is an imprint method including pressing a template for imprint onto a light curing resin on a transfer target substrate. The method further includes irradiating the light curing resin with light while the template is pressed onto the light curing resin, to cure the light curing resin. The method further includes demolding the template from the light curing resin while controlling a demold speed or a demold angle of the template, based on a position of a shot region from which the template is to be demolded.

First Embodiment

Figure 1:
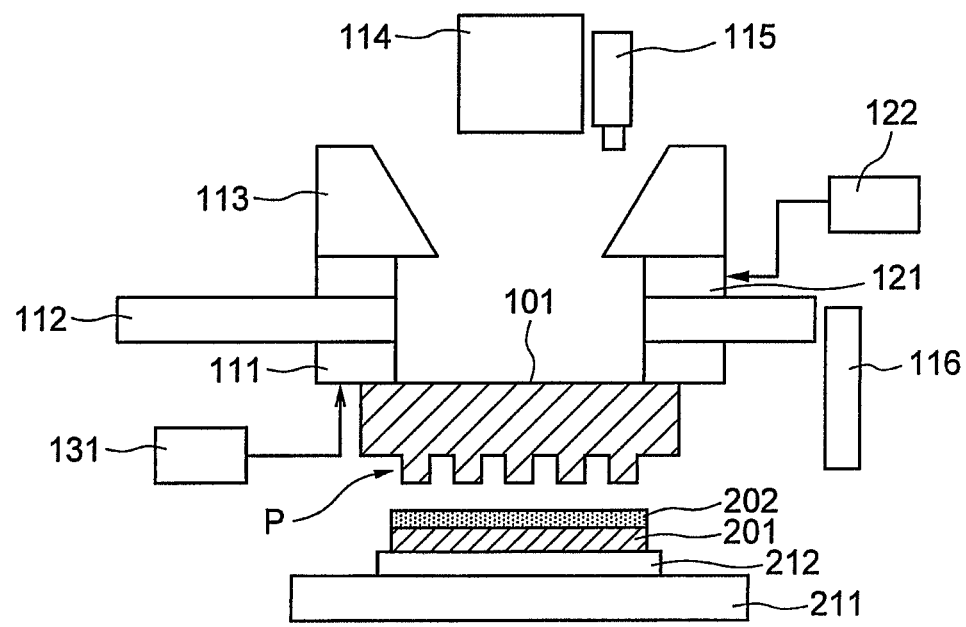
FIG. 1 is a side sectional view showing a structure of a nanoimprint apparatus according to a first embodiment.

FIG. 1 is a side sectional view showing a structure of a nanoimprint apparatus according to a first embodiment.

The nanoimprint apparatus in FIG. 1 includes a template stage 111, a base 112, an alignment sensor 113, an ultraviolet (UV) light source 114, a charge coupled device (CCD) camera 115, a resist dropping device 116, a sample stage 211, and a sample chuck 212.

The sample stage 211 is used for setting a wafer 201 as a transfer target substrate. The wafer 201 is chucked by the sample chuck 212 such as a vacuum chuck to be fixed on the sample stage 211. In FIG. 1, a resist material 202 as a light curing resin is formed on the wafer 201. The resist material 202 for nanoimprint is called imprint material.

The template stage 111 is configured to holding the template 101 for nanoimprint. In the nanoimprint apparatus in FIG. 1, the template stage 111 can be moved upward or downward so that the template 101 is pressed onto the resist material 202 or demolded from the resist material 202. The template stage 111 is an example of a template holding part and a template moving part. The template stage 111 is attached to the base 112 positioned above the template stage 111.

FIG. 1 shows a concavo-convex pattern provided on the template 101, which is indicated by P. The template 101 is set on the template stage 111 such that the surface with the concavo-convex pattern P is the bottom surface and its opposite surface is the top surface.

The alignment sensor 113 is configured to detect an alignment mark on the template 101 or the wafer 201.

The UV light source 114 is configured to irradiate the resist material 202 with UV light to cure the resist material 202. In the nanoimprint apparatus in FIG. 1, the resist material 202 is irradiated with UV light while the template 101 is pressed onto the resist material 202, to cure the resist material 202. As a result, a resist pattern is formed on the wafer 201. In the nanoimprint apparatus in FIG. 1, the template 101 is then demolded from the resist material 202.

The light source used in the present embodiment may be other than the UV light source, if it generates the light capable of curing the resist material 202.

In addition, the CCD camera 115 is configured to monitor the template 101. The resist dropping device 116 is configured to drop resist on the wafer 201.

The template 101 in the present embodiment is made of a transparent material such as quartz for enabling the detection of the alignment mark, the irradiation of the wafer 201 with UV light, and the monitoring of the template 101.

The nanoimprint apparatus in FIG. 1 further includes a demold control unit 121, a demold control calculator 122, and a shot order setting part 131.

The demold control unit 121 is configured to control a demold operation performed by the template stage 111. The demold control unit 121 controls a demold speed or a demold angle of the template 101 when demolding the template 101 from the resist material 202. The demold control calculator 122 is configured to calculate the demold speed or the demold angle. The demold control unit 121 and the demold control calculator 122 are an example of a demold control part.

The shot order setting part 131 is configured to set a shot order of each shot region on the wafer 201. The nanoimprint apparatus in FIG. 1 moves the template stage 111 in the shot order to imprint the pattern on each shot region. The shot order setting part 131 will be described in detail in a sixth embodiment described below.

The demold operation performed by the template stage 111, the demold control unit 121, and the demold control calculator 122 in the first embodiment will be described below in detail.

Figure 2:
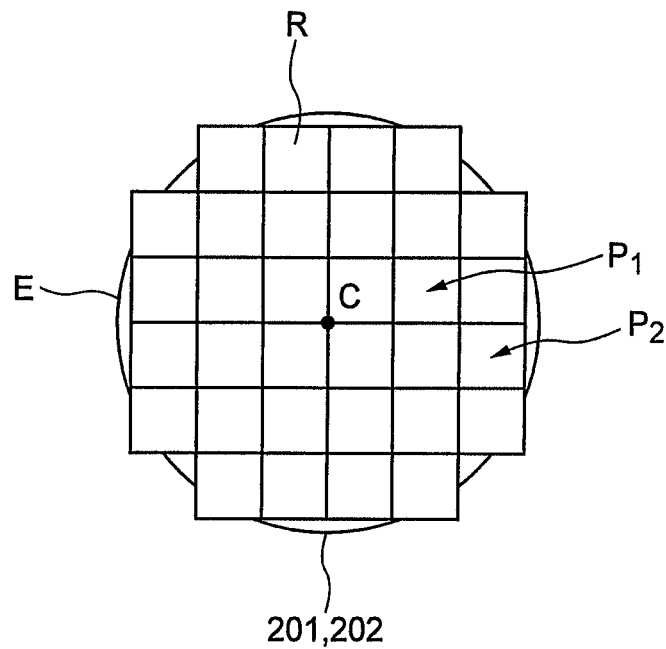
FIG. 2 is a plan view for explaining a demold operation according to the first embodiment.

FIG. 2 is a plan view for explaining the demold operation according to the first embodiment.

FIG. 2 shows the wafer 201 viewed from above. In FIG. 2, the center point on the wafer 201 is denoted by C, and the edge of the wafer 201 is denoted by E. The wafer 201 substantially has a circular planar shape. The center point C and the edge E correspond to the center and the circumference of the circle, respectively.

In FIG. 2, shot regions on the wafer 201 are denoted by R. In the nanoimprint apparatus of the present embodiment, patterns are formed on the wafer 201 in unit of shot region R. FIG. 2 shows 32 shot regions R by way of example.

The demold control calculator 122 of the present embodiment determines a demold speed or a demold angle of the template 101, based on a position of a shot region R from which the template 101 is to be demolded, when demolding the template 101 from the resist material 202. For example, the demold speed is set at $V_1$ for a shot region R positioned at point $P_1$, while the demold speed is set at $V_2$ for a shot region R positioned at point $P_2$.

Then, the demold control unit 121 of the present embodiment controls the demold speed or angle of the template 101 into the determined demold speed or angle. Consequently, the template 101 is demolded from the resist material 202 at the determined demold speed or angle.

The position of the shot region R can be indicated by using an imprint coordinate of the shot region R, for example. The imprint coordinate corresponds to a coordinate of the shot region R in the in-plane direction of the wafer 201.

Effects of such demold operation will be described herein.

As described above, in the nanoimprint apparatus for the step and repeat method, the wafer chuck force near the periphery on the wafer 201 is weaker than that near the center on the wafer 201. Therefore, when the template 101 is demolded from the periphery, the wafer 201 may be detached from the sample chuck 212.

This can be prevented by reducing the demold speed of the template 101 over the entire wafer 201. However, if the demold speed is reduced over the entire wafer 201, throughput of the pattern formation is lowered.

Therefore, in the present embodiment, the demold speed of the template 101 is controlled based on a position of a shot region R from which the template 101 is to be demolded. This makes it possible to optimize the demold speed of the template 101 per shot region R.

For example, in the present embodiment, only the demold speed of the shot region R near the periphery on the wafer 201, from which the wafer 201 is easily detached, can be selectively lowered. This makes it possible to prevent the detachment of the wafer 201 while preventing the decrease in throughput of the pattern formation to the minimum.

The detachment of the wafer 201 can also be prevented by adjusting the demold angle of the template 101. A specific example of adjusting the demold angle will be described in a third embodiment described below. On the other hand, a specific example of adjusting the demold speed will be described in detail in a second embodiment described below.

As described above, in the present embodiment, the demold speed or demold angle of the template 101 is controlled based on the position of the shot region R from which the template 101 is demolded. Therefore, in the present embodiment, the demold speed or demold angle of the template 101 can be optimized per shot region R. For example, the present embodiment makes it possible to prevent the detachment of the wafer 201 while preventing the decrease in throughput of the pattern formation.

Second to sixth embodiments as modifications of the first embodiment will be described below. The second to sixth embodiments will be described mainly for the differences with the first embodiment.

Second Embodiment

Figure 3:
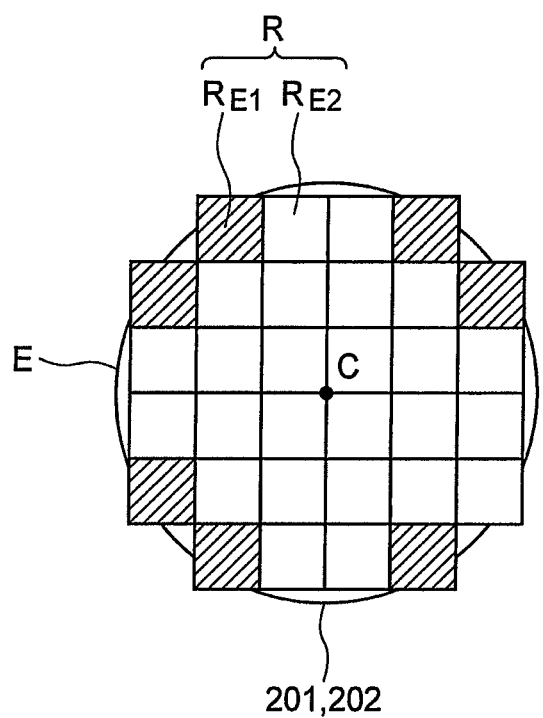
FIG. 3 is a plan view for explaining a demold operation according to a second embodiment.

FIG. 3 is a plan view for explaining a demold operation according to a second embodiment.

In FIG. 3, the shot regions R positioned on the edge E of the wafer 201 are denoted by $R_{E1}$, and the shot regions R positioned inside the edge E are denoted by $R_{E2}$. The shot regions $R_{E1}$ positioned on the edge E are called "chipped shots".

The demold operation on the chipped shots will be described herein.

The edge E is located at the boundary between a portion in which the wafer 201 is bonded with the template 101 via the resist material 202 and a portion in which the wafer 201 is not bonded. Therefore, during the demold operation at a chipped shot, the force applied on the wafer 201 is uneven, so that the wafer 201 easily floats from the sample chuck 212. Accordingly, the vacuum breaks from the floating portion, so that the wafer 201 is detached.

Therefore, in the present embodiment, the demold speed on the shot regions $R_{E1}$ positioned on the edge E is set to be slower than the demold speed on the shot regions $R_{E2}$ positioned inside the edge E. In other words, the demold speed on the chipped shots is selectively lowered in the present embodiment.

Therefore, in the present embodiment, during the demold operation on the chipped shots, the deviation of the force applied on the wafer 201 can be reduced, and consequently the wafer 201 can be prevented from floating from the sample chuck 212. Accordingly, in the present embodiment, the generation of the broken vacuum and the detachment of the wafer 201 can be prevented.

Figure 4:
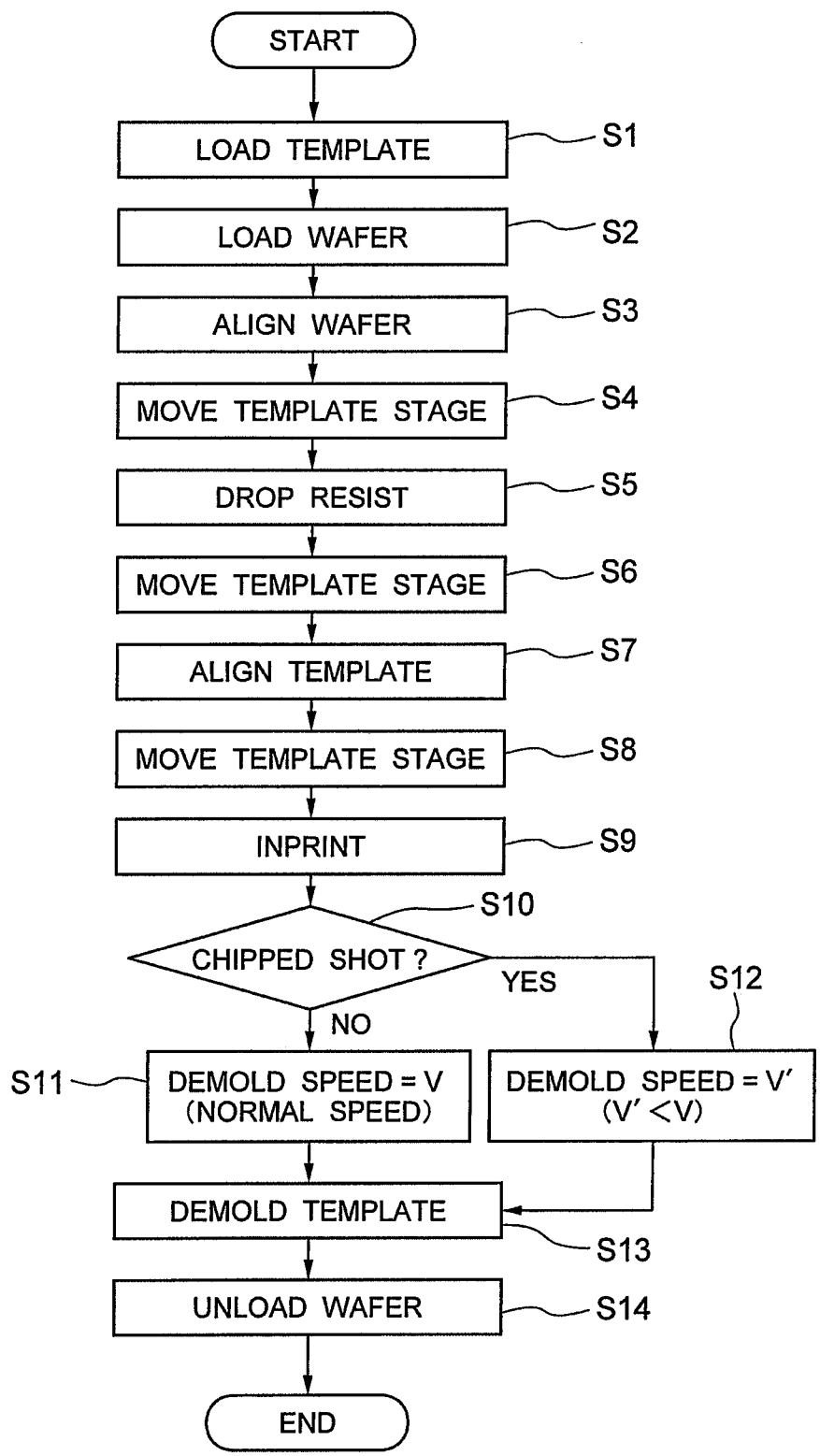
FIG. 4 is a flowchart for explaining a nanoimprint method according to the second embodiment.

FIG. 4 is a flowchart for explaining the nanoimprint method according to the second embodiment. Regarding the structure of the nanoimprint apparatus which is referred to in the explanation of FIG. 4, refer to FIG. 1.

First, the template 101 is loaded on the template stage 111 (step S1). The wafer 201 is then loaded on the sample table 211 (step S2). The alignment sensor 113 then performs an alignment process of the wafer 201 (step S3).

Then, the template stage 111 is moved such that the resist dropping device 116 is immediately above the wafer 201 (step S4). The resist dropping device 116 then drops resist on the wafer 201 (step S5). As a result, the resist material 202 is formed on the wafer 201.

Then, the template stage 111 is moved to the position for the alignment process of the template 101 (step S6). The alignment sensor 113 then performs the alignment process of the template 101 (step S7).

Then, the template stage 111 is moved above a shot region R for imprint (step S8). A pattern is then imprinted on the shot region R by the template stage 111 and the like (step S9). In step S9, the template 101 is pressed onto the resist material 202, and the resist material 202 is irradiated with UV light in this state. As a result, the resist material 202 is cured, so that the pattern is transferred.

Then, the demold control calculator 122 determines whether the shot region R is a chipped shot (step S10). When the shot region R is not a chipped shot, the demold speed is set at a normal speed V (step S11). On the other hand, when the shot region R is a chipped shot, the demold speed is set at a speed V' slower than the normal speed V (step S12).

Then, the nanoimprint apparatus demolds the template 101 from the resist material 202 while controlling the demold speed at V or V' by the demold control unit 121 (step S13). The processes in steps S1 to S13 except for the overlapping processes are performed on each shot region R on the wafer 201. Then, the wafer 201 is unloaded from the sample table 211 (step S14).

The demold speed V' on the chipped shots may be set to be different per chipped shot. For example, the demold speed V' may be decreased with the size of the chipped shot on the wafer 201. Also, the demold speed V' may be changed according to the ratio of the concave area of the template 101 to the convex area.

As described above, in the present embodiment, the demold speed on the shot regions $R_{E1}$ positioned on the edge E is set to be slower than that on the shot regions $R_{E2}$ positioned inside the edge E. Therefore, in the present embodiment, the detachment of the wafer 201 on the chipped shots, from which the wafer 201 is easily detached, can be prevented.

Third Embodiment

Figure 5:
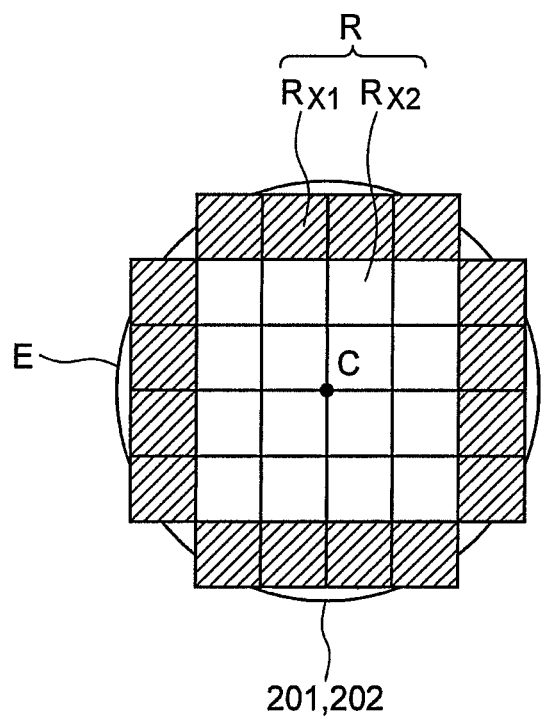
FIG. 5 is a plan view for explaining a demold operation according to a third embodiment.

FIG. 5 is a plan view for explaining a demold operation according to a third embodiment.

In FIG. 5, the shot regions R positioned at the periphery on the wafer 201 are denoted by $R_{X1}$, and the shot regions R positioned inside the periphery are denoted by $R_{X2}$. Among the shot regions R on the wafer 201, the shot regions $R_{X1}$ are positioned outside, and the shot regions $R_{X2}$ are positioned inside.

Hereinafter, the portion occupied by the shot regions $R_{X1}$ on the wafer 201 is referred to as "periphery portion", and the portion occupied by the shot regions $R_{X2}$ on the wafer 201 is referred to as "center portion".

The demold operations on the periphery portion and the center portion will be described herein.

The sample chuck 212 ordinary contacts the backside of the wafer 201 in surface contact, and sucks the backside of the wafer 201. The sample chuck 212 is ordinary configured such that the suction acting on the backside of the wafer 201 is symmetrical with respect to the center point C.

However, when the template 101 is demolded from the periphery portion which is near the edge E of the wafer 201, the symmetry of the force applied on the wafer 201 largely breaks, because a strong force for the demold acts on a point away from the center point C. Therefore, during the demold operation from the periphery portion, the force applied on the wafer 201 is uneven, so that the wafer 201 easily floats from the sample chuck 212. As a result, the vacuum breaks from the floating portion, so that the wafer 201 is detached.

Therefore, in the present embodiment, during the demold operation on the shot regions $R_{X1}$ in the periphery portion, the demold angle of the template 101 is set to incline the template 101 in a direction in which the floating of the wafer 201 is prevented, relative to the direction vertical to the principal surface of the wafer 201.

Therefore, in the present embodiment, during the demold operation on the periphery portion, the wafer 201 can be prevented from floating from the sample chuck 212. As a result, in the present embodiment, the break of the vacuum and the detachment of the wafer 201 can be prevented.

FIGS. 6A and 6B are side sectional views for explaining the demold angle of the template 101.

FIG. 6A shows the demold operation on the shot regions $R_{X2}$ in the center portion. In FIG. 6A, the arrow D indicates the direction vertical to the principal surface of the wafer 201, and the symbol V indicates the demold speed of the template 101. In the present embodiment, during the demold operation from the center portion, the demold angle of the template 101 is set to be parallel to the direction D as shown in FIG. 6A.

On the other hand, FIG. 6B shows the demold operation on the shot regions $R_{X1}$ in the periphery portion. In the present embodiment, during the demold operation from the periphery portion, the demold angle of the template 101 is set to incline the template 101 in the direction in which the floating of the wafer 201 is prevented, relative to the direction D. The direction in which the floating is prevented is a direction facing the outside of the wafer 201, as shown in FIG. 6B. In FIG. 6B, the demold angle of the template 101 is denoted by the symbol θ.

As described above, in the present embodiment, the demold angle on the shot regions $R_{X1}$ in the periphery portion is set to incline the template 101 relative to the direction vertical to the principal surface of the wafer 201. Therefore, in the present embodiment, the detachment of the wafer 201 on the periphery portion, from which the wafer 201 is easily detached, can be prevented.

In the third embodiment, the demold speed on the shot regions $R_{X1}$ in the periphery portion may be set to be slower than that on the shot regions $R_{X2}$ in the center portion, similarly to the second embodiment. This method also makes it possible to prevent the detachment of the wafer 201 from the periphery portion.

To the contrary, in the second embodiment, the demold angle on the chipped shots may be set to incline the template 101 relative to the direction vertical to the principal surface of the wafer 201, similarly to the third embodiment. This method also makes it possible to prevent the detachment of the wafer 201 from the chipped shots.

In the third embodiment, the adjustment of the demold angle may be used with the adjustment of the demold speed. Similarly, in the second embodiment, the adjustment of the demold speed may be used with the adjustment of the demold angle. This is also applicable to the above first embodiment and the following fourth and fifth embodiments.

Fourth Embodiment

Figure 7:
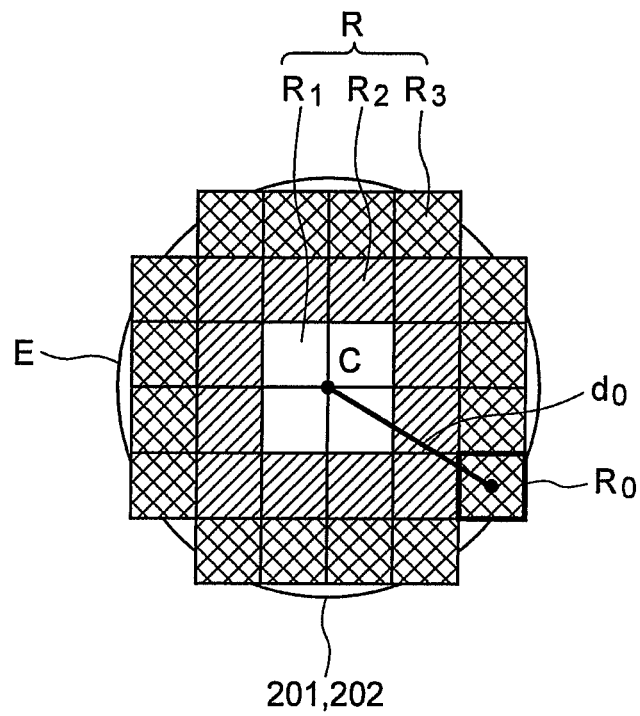
FIG. 7 is a plan view for explaining a demold operation according to a fourth embodiment.

FIG. 7 is a plan view for explaining a demold operation according to a fourth embodiment.

In FIG. 7, the shot regions R on the wafer 201 are classified into three types, depending on the distance from the center point C. The shot regions $R_1$, $R_2$, and $R_3$ correspond to regions whose distances from the center point C are short, middle, and long, respectively.

The distance between the center point C and each shot region R is exemplified with the symbol $d_0$. The symbol $d_0$ indicates the distance between a shot region $R_0$ and the center point C.

In the present embodiment, the demold speed of the template 101 is controlled based on the distance between the center point C and each shot region R. Specifically, in order to decrease the demold speed with increasing distance between the center point C and each shot region R, the demold speeds on the shot regions $R_1$, $R_2$, and $R_3$ are set to be high, middle, and low, respectively.

Effects of the demold operation according to the present embodiment will be described.

As described in the third embodiment, the sample chuck 212 is ordinary configured such that the suction acting on the backside of the wafer 201 is symmetrical with respect to the center point C.

Therefore, as the shot region R is further from the center point C, the symmetry of the force applied on the wafer 201 largely breaks due to the force for the demold, when the template 101 is to be demolded. Therefore, as the shot region R is further from the center point C, the force applied on the wafer 201 becomes uneven, so that the wafer 201 easily floats from the sample chuck 212. As a result, the vacuum breaks from the floating portion, so that the wafer 201 is detached.

Therefore, in the present embodiment, the demold speed of the template 101 is decreased with increasing distance between the center point C and the shot region R. Accordingly, in the present embodiment, the effect of preventing the detachment can be further enhanced as the distance between the center point C and the shot region R is longer.

As described above, in the present embodiment, the demold speed of the template 101 is controlled based on the distance between the center point C on the wafer 201 and the shot region R. Therefore, in the present embodiment, the demold speed of the template 101 can be optimized per shot region R depending on the distance from the center point C. For example, in the present embodiment, the demold speed is decreased with increasing distance between the center point C and the shot region R. In this case, the effect of preventing the detachment can be further enhanced as the distance between the center point C and the shot region R is longer.

Fifth Embodiment

Figure 8:
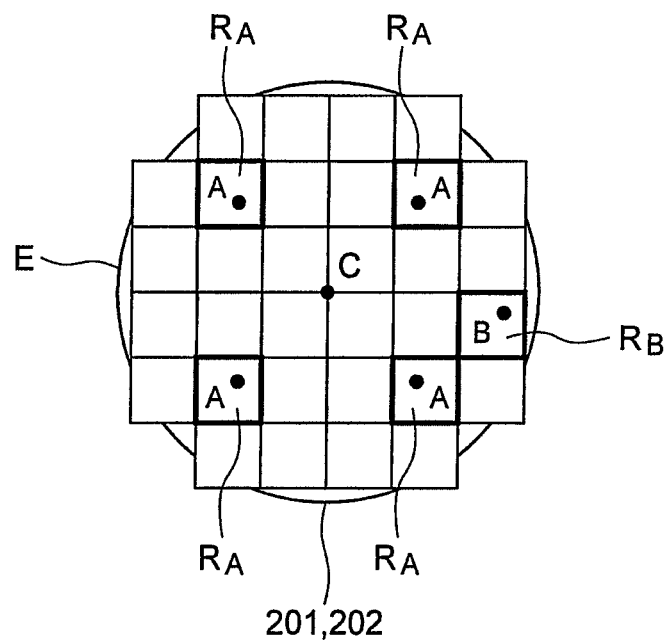
FIG. 8 is a plan view for explaining a demold operation according to a fifth embodiment.

FIG. 8 is a plan view for explaining a demold operation according to a fifth embodiment.

The symbols "A" shown in FIG. 8 indicate positions in which chuck pins of the sample chuck 212 contact the backside of the wafer 201. The wafer 201 is vacuumed by the sample chuck 212 at the positions of the chuck pins.

The suction of the sample chuck 212 is strong near the chuck pins, and is weak away from the chuck pins. Therefore, when the template 101 is demolded from a point away from the chuck pins, the wafer 201 is easily detached.

Therefore, in the present embodiment, the demold speed of the template 101 is controlled based on the contact position "A" of the chuck pins. For example, the demold speed is set high on the shot regions $R_A$ including the contact positions "A" of the chuck pins, and is set low in other shot regions R. Therefore, the detachment of the wafer 201 can be prevented.

The symbol "B" shown in FIG. 8 indicates a position of a dust on the backside of the wafer 201. The dust is adhered on the backside of the wafer 201, or on the top surface of the sample chuck 212. The dust can be detected by examining the wafer 201 or the sample chuck 212.

Since the wafer 201 is floating from the sample chuck 212 at the position of the dust, the suction of the sample chuck 212 is weakened. Therefore, when the template 101 is demolded from the position of the dust, the wafer 201 is easily detached.

Therefore, in the present embodiment, the demold speed of the template 101 is controlled based on the position "B" of the dust. For example, the demold speed is set low on the shot region $R_B$ including the position "B" of the dust, and is set high in other shot regions R. Therefore, the detachment of the wafer 201 can be prevented.

In the present embodiment, those two examples may be applied in combination. In other words, the demold speed of the template 101 may be controlled based on the contact positions "A" of the chuck pins and the position "B" of the dust on the backside of the wafer 201. As a result, the detachment of the wafer 201 can be more effectively prevented.

Effects of the chuck pins and the dust appear as a difference in suction between areas on the backside of the wafer 201. For example, the suction is strong in some areas, and is weak in other areas.

Therefore, in the present embodiment, the demold speed of the template 101 may be controlled based on a distribution of suction which sucks the backside of the wafer 201. This makes it possible to control the demold speed in consideration of total suction, which is not determined by individual factors influencing the suction such as the chuck pins or the dust, but is determined by all the factors including them. This can effectively prevent the detachment of the wafer 201 (conversely, the above two methods are useful when it is preferred to take individual factors into consideration).

The distribution of suction can be estimated by an actual imprint on the template 101. For example, if the wafer 201 is easily detached on a shot region R in the actual imprint, the suction on the shot region R can be estimated to be weak. On the other hand, if the wafer 201 is difficult to detach on a shot region R in the actual imprint, the suction on the shot region R can be estimated to be strong. In order to quantitatively estimate the suction, the number of detachments or the detachment rate may be examined for each shot region R, and may be used for determining the suction, for example.

As described above, in the present embodiment, the demold speed of the template 101 is controlled based on the contact positions of the chuck pins, the position of the dust, or the distribution of suction on the backside of the wafer 201. Therefore, in the present embodiment, the detachment of the wafer 201 on the shot regions R having weaker suction can be prevented.

Sixth Embodiment

Figure 9:
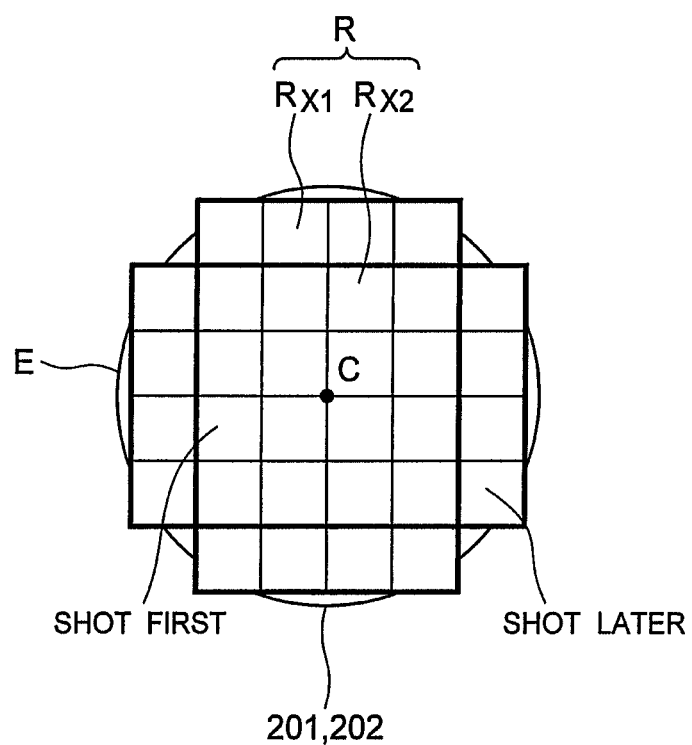
FIG. 9 is a plan view for explaining a nanoimprint method according to a sixth embodiment.

FIG. 9 is a plan view for explaining a nanoimprint method according to a sixth embodiment. In FIG. 9, the shot regions R positioned in the periphery portion and the center portion are denoted by $R_{X1}$ and $R_{X2}$, respectively, similarly to FIG. 5.

Defects in the resist pattern are more easily generated in the periphery portion than the center portion. If the imprint process is continued after a defect is generated, defects are repeatedly generated on the shot regions R to be later patterned.

Therefore, in the present embodiment, the shot order of each shot region R is set based on whether each shot region R is positioned in the periphery portion or the center portion. Specifically, the imprint process is first performed on all the shot regions $R_{X2}$ in the center portion, and is then performed on all the shot regions $R_{X1}$ in the periphery portion.

In the present embodiment, the imprint process is started from the center portion containing fewer defects as the above, so that the defects can be prevented from being repeated in many shot regions R. In addition, since the detachment of the wafer 201 is more difficult to occur on the center portion than the periphery portion, the imprint process starting from the center portion has the effect that it can prevent the detachment in a shot region R from affecting many other shot regions R.

The shot order of the shot regions $R_{X2}$ within the center portion may be randomly determined, or may be determined based on any rule. Similarly, the shot order of the shot regions $R_{X1}$ within the periphery portion may be randomly determined, or may be determined based on any rule.

For example, when a shot region $R_{X2}$ in the center portion contains a dust, this shot region $R_{X2}$ may be finally shot within the center portion. Similarly, when a shot region $R_{X1}$ in the periphery portion contains a dust, this shot region $R_{X1}$ may be finally shot within the periphery region.

Also, a shot region R containing a dust may be shot at the end of all the shot regions R, irrespective of whether this shot region R is positioned in the center portion or the periphery portion.

As described above, in the present embodiment, the shot order of each shot region R is set based on whether each shot region R is positioned in the periphery portion or the center portion. This makes it possible to prevent undesirable phenomena such as defects and detachment from affecting many shot regions R.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. An imprint apparatus comprising:
   a template holding part configured to hold a template for imprint;
   a template moving part configured to move the template to press the template onto a light curing resin on a transfer target substrate or to demold the template from the light curing resin;
   a light source configured to irradiate the light curing resin with light to cure the light curing resin;
   a demold control calculator configured to determine a demold speed or a demold angle of the template, based on a position of a shot region from which the template is to be demolded, when demolding the template from the light curing resin; and
   a demold controller configured to control the demold speed or the demold angle of the template demolded from the shot region by the template moving part, into the demold speed or the demold angle determined for the shot region by the demold control calculator.

2. The apparatus of claim 1, wherein
   the demold control calculator is configured to set the demold speed on a shot region positioned on an edge of the transfer target substrate, to be slower than the demold speed on a shot region positioned inside the edge.

3. The apparatus of claim 1, wherein
   the demold control calculator is configured to set the demold speed on a shot region positioned at a periphery on the transfer target substrate, to be slower than the demold speed on a shot region positioned inside the periphery.

4. The apparatus of claim 1, wherein
   the demold control calculator is configured to set the demold angle on a shot region positioned at a periphery on the transfer target substrate, to incline the template relative to a direction vertical to a principal surface of the transfer target substrate.

5. The apparatus of claim 1, wherein
   the demold control calculator is configured to set the demold angle on a shot region positioned on an edge of the transfer target substrate, to incline the template relative to a direction vertical to a principal surface of the transfer target substrate.

6. The apparatus of claim 1, wherein
   the demold control calculator is configured to determine the demold speed, based on a distance between a center point on the transfer target substrate and the shot region.

7. The apparatus of claim 1, wherein
   the demold control calculator is configured to determine the demold speed, based on a distribution of suction by which a backside of the transfer target substrate is sucked.

8. The apparatus of claim 1, wherein
   the demold control calculator is configured to determine the demold speed, based on a contact position of a chuck pin onto a backside of the transfer target substrate, or a position of a dust on the backside of the transfer target substrate.

9. The apparatus of claim 1, further comprising a shot order setting part configured to set a shot order of each shot region on the transfer target substrate,
   wherein
   the shot order setting part is configured to set the shot order, based on whether each shot region is positioned at a periphery on the transfer target substrate or inside the periphery, and
   the template moving part is configured to move the template in the shot order set by the shot order setting part.

10. The apparatus of claim 9, wherein
    the shot order setting part is configured to set the shot order, based on a position of a dust on a backside of the transfer target substrate.

* * * * *